United States Patent [19]
Jones

[11] Patent Number: 4,871,317
[45] Date of Patent: Oct. 3, 1989

[54] SURFACE MOUNTED COMPONENT ADAPTOR FOR INTERCONNECTING OF SURFACE MOUNTED CIRCUIT COMPONENTS

[75] Inventor: Robert E. Jones, Saint Peters, Mo.

[73] Assignee: A. O. Smith Corporation, Milwaukee, Wis.

[21] Appl. No.: 127,786

[22] Filed: Dec. 2, 1987

[51] Int. Cl.$^4$ .............................................. H01L 23/12
[52] U.S. Cl. ........................................ 439/68; 29/840; 174/52.4; 361/400
[58] Field of Search ...................... 439/67–71; 361/392–398, 400–405; 174/52 FP; 29/830, 847, 840

[56] References Cited

U.S. PATENT DOCUMENTS

| | | | |
|---|---|---|---|
| 3,262,023 | 7/1966 | Boyle | 361/393 |
| 3,289,048 | 11/1966 | Allegretti et al. | 361/396 |
| 3,353,139 | 11/1967 | Ribbelink | 439/68 |
| 3,662,230 | 5/1972 | Redwantz | 174/52 FP |
| 3,780,431 | 12/1973 | Feeney | 29/830 |
| 4,074,342 | 2/1978 | Honn et al. | 357/74 |
| 4,231,154 | 11/1980 | Gazdik et al. | 29/847 |
| 4,530,552 | 7/1985 | Meehan et al. | 174/52 FP |
| 4,618,739 | 10/1986 | Theobald | 174/52 FP |

OTHER PUBLICATIONS

IBM Bulletin, Jarvela, vol. 14, No. 10, p. 2896, 3–1972.

*Primary Examiner*—Neil Abrams
*Attorney, Agent, or Firm*—Andrus, Sceales, Starke & Sawall

[57] ABSTRACT

A surface mounted component adaptor permits connecting of surface mounted components in a prototype circuit. The adaptor includes a printed circuit board having the connection pad array for reflow soldering a surface mounted component to the board and two parallel rows of conventional through-hole connectors with through-hole or leaded pin connectors. Preprinted conductors connect the connection pads to the through-hole connectors. With the surface mounted components soldered to the adaptor, a plug-in unit is formed for connection to a prototype vector board. The adaptor permits the convenient assembly, connection and reconnection of the various surface mounted components to the prototyping vector board. Different adaptors are provided for the various classes of surface mounted components. Groups of the different adaptors are printed and formed on a single insulating sheet which can be conveniently cut using a sharp instrument, such as scissors. The adaptors are arranged in corresponding rows and columns with dotted separating lines for convenient separation of the individual adaptors from the sheet by use of a scissors.

9 Claims, 2 Drawing Sheets

SURFACE MOUNTED COMPONENT ADAPTOR FOR INTERCONNECTING OF SURFACE MOUNTED CIRCUIT COMPONENTS

BACKGROUND OF THE PRESENT INVENTION

The present invention is directed to a circuit board adaptor for prototyping electrical circuits with surface mounted components and particularly such an SMC adaptor facilitating the use of conventional leaded component prototyping hardware.

Surface mounted electronic components are used in fabricating electronic circuits for providing an improved effective method of producing complex circuits employing solid state electronic components and the like.

During product development using electronic components, various circuit arrangements and connections are built and tested to arrive at a final product design. Surface mounted components are small components having interconnecting leads which are difficult to connect and reconnect into a circuit during the design an prototyping of particular circuit.

In contrast, for conventional leaded components prototype circuit fabrication techniques are highly developed and hardware is available to facilitate prototype circuit fabrication. For example, leaded components can be mounted and interconnected on a variety of component adapters. Sockets are available to mate with the components adapters and vector boards or prototype circuits boards featuring multiple solder pads predrilled to accept the sockets along with buses for power supply connections.

Surface mounted components and particularly with the interconnecting corresponding leads make it extremely difficult, time consuming and expensive during prototyping of like product development to provide for the necessary wiring and rewiring.

Various prior art devices have been provided for minimizing the difficulties associated with the development of circuits including involving surface mounted components. For example, U.S. Pat. No. 4,489,365 which issued Dec. 18, 1984 discloses a multiple element mounting pad particularly adapted for receiving various universal leadless chip carriers. The pad disclosed is applicable to a wide range of the chip carrier sizes and therefore permits some convenience during prototyping, burn-in components and the like. Another adaptor for a leadless chip carrier is shown in U.S. Pat. No. 4,564,251 which issued Jan. 14, 1986, wherein an adaptor includes a base element which fits into a connecting socket. The base element has multiple pads that contact the terminals of the socket. An interface element extends upwardly from the base element to receive a leadless chip carrier and provides for connection of laboratory test equipment and the like. These and other patents disclose units which are specially adapted to a leadless chip carrier. However, the prior art does not provide solutions for the more conventional surface mounted components which require lead wire connections.

There remains a need for an adaptor for surface mounted components which will permit the interconnection of the surface mounted components into various circuit configurations for prototyping and the like, and an adaptor which preferably operates and uses existing prototype hardware and technologies, including conventional through-hole printed circuit board devices.

SUMMARY OF THE PRESENT INVENTION

The present invention is particularly directed to a surface mounted component adaptor permitting the interconnection of the surface mounted components in circuit using a conventional circuit board system. More particularly in accordance with the concept of the present invention, the adaptor consists of a small printed circuit board containing the necessary conductive printed art work for interconnection of various surface mounted components. The art work connects the surface mounted components pads to a pair of parallel rows of conventional through-hole component pads and component adapters. The surface mounted adaptor (SMA) can be constructed with the preprinted circuit conductors and a plurality of parallel apertures spaced i accordance with the conventional through-hole or leaded component adaptor. The adaptor pad is deposited onto a conventional leaded adaptor with the apertured pads soldered or otherwise electrically secured to the corresponding pins. In either event, the surface mounted components is now simply soldered to the printed circuit board adaptor to provide a component for plug-in connection into the prototype vector board in accordance with conventional practice. To change the prototype circuit, the adaptor is conveniently and rapidly removed, with the circuit component replaced or rearranged in the circuit, as desired.

The surface mounted component adaptor thus permits the convenient assembly, connection and reconnection of the various surface mounted components to the prototyping vector board with convenient means for revision and changes in the prototype.

The art work has spaced connections adapted to receive the surface mounted components secured thereto in accordance with any conventional practice. The surface mounted art work on the adaptor therefore does not provide any connection between the adaptors parallel contact. Such interconnection only results from the mounting of the surface mounted components to the adaptor plate.

The present invention provides an adaptor which is directly compatible with the existing prototype hardware and technology, thereby providing convenient and readily understood application and use by those in the art. The time and cost for prototyping of the surface mounted component circuits are significantly reduced. Further, the adaptor with the parallel multiple interconnections will readily be recognized as eliminating the need to separately surface mount the components in any given design for rapid turn around in making different prototypes.

More particularly in a particular advantageous adaptation of the present invention, different adapters are provided to accommodate the various classes of surface mounted components. A substantial plurality of each adaptor elements are printed and formed on a single large flexible insulating sheet which can be conveniently cut using a sharp instrument, such as scissors. The individual adaptor elements are preferably identified on the board and arranged in corresponding rows and columns. Dotted lines or other indicia outline the several elements for convenience of separation of the individual elements from the sheet. The flexible sheet thus contains one or more different layouts of the surface mounted component connectors to accomodate the various standard formats of surface mounted components used commercially and available as a standard connector arrangement. The circuit designer can then have one or more of the adaptor sheets available for rapid selection of the necessary basic pad structures for the various types of circuit components. The material of the flexible card is readily separated into the individual adaptor pads using a hand operated knife, scissors, cutting board or other similar devices.

The present invention provides a simple reliable and effective means for creating various surface mounted electronic component models in the prototyping stage of a new product or the like. The adaptor unit will be readily understood and used by those skilled in the art in view of its direct usage of a conventional through-hole or leaded component technology and approach. Further, the SMA adaptor units are readily mass produced using present day technology and available at reasonable cost.

DESCRIPTION OF THE DRAWINGS

The drawings furnished herewith illustrate the best mode presently contemplated for carrying out the invention in which the above features and advantages as well as others are disclosed and described hereinafter.

In the drawings.

DESCRIPTION OF THE ILLUSTRATED EMBODIMENT

Figure 1:
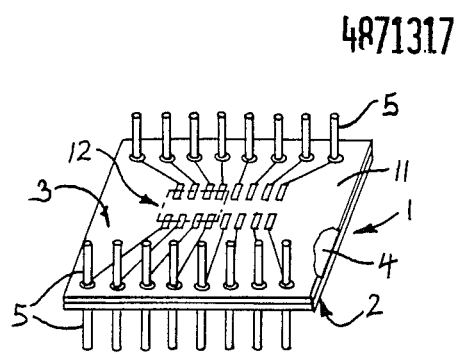
FIG. 1 is a view illustrating a surface mounted component adaptor element constructed in accordance with the teaching of the present invention and a conventional leaded component adapter.
Figure 2:
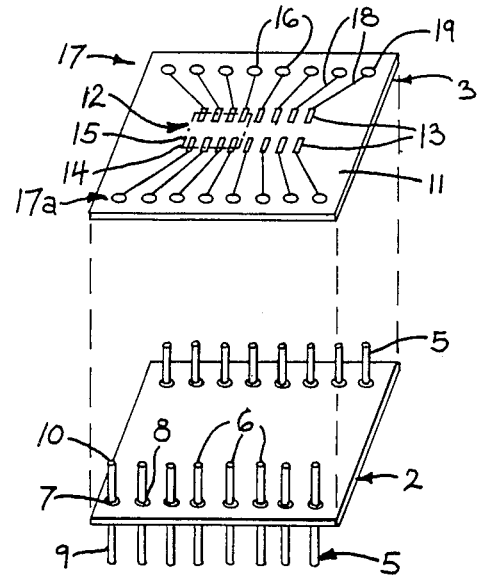
FIG. 2 is an exploded view of the adaptor shown in FIG. 1.

Referring particularly to FIGS. 1 and 2 of the drawings, a surface mounted component adaptor unit 1 constructed in accordance with the teaching of the present invention is illustrated. The adaptor unit 1 consist of a base element 2 in a form of a conventional through-hole component adaptor element and a surface mount adaptor element 3.

The conventional component adaptor element 2 includes a flat rigid insulating plate 4 of a rectangular configuration. Parallel rows of connector through-pins 5 are secured one row along each of the long side of the insulating plate. In the illustrating embodiment of the invention, each row contains eight equally spaced contact pins 6. Each pin 6 includes a central body portion 7 embedded within the plate. The body portion 7 projects outwardly from the one surface which is formed in the row as a raised portion to define a ledge 8. Relatively thin contact pins 9 and 10 project outwardly from the opposite sides of the body portion 7. This constitutes a conventional and widely used through-hole, or leaded component adapter.

Generally, circuit components are positively wired to one side of the element, such as that including pin 10. The individual elements are soldered between particular pins 7 in each of the two rows. The opposite pins 9 provide plug-in connectors for introduction into a conventional vector board, not shown, for producing interconnection between the components of the unit 1 and the other similar components formed on other modules or units. In prototyping, the modules can be quickly and conveniently changed t produce desired redesign and construction. It is practically impossible to hand wire surface mounted components to the conventional plug-in units such as just described.

In accordance with the present invention, the SMC adaptor component or element 3 is constructed for mounting the surface mounted component and is formed for releasable coupling to the standard pin module vector board. The surface mount component adaptor element 3 includes a relatively thin insulating plate 11 formed of a flexible printed circuit board material. The flexible printed circuit board element or plate 11 is pre-etched with appropriate printed conductors 12 including centrally located rows of spaced connecting solder pads 13. Each of the pads 13 is shown as a small rectangular portion adapted to receive a surface mounted component terminal 14 of an SMC component 15 with conventional interconnection as by reflow soldering or the like. The plate 11 includes contact openings or holes 16 arranged in spaced rows 17 and 17a along each of the opposite edges of the plate. Each of the pads 13 is connected to a separate contact hole by a pre-etched printed lead 18 which terminates in a printed conductive contact 19 applied to the hole. The illustrated SMC adaptor element 3 is formed with eight pads in each row connected one each by the preprinted circuits to the corresponding connecting apertures 16 in each row 17-17a.

Figure 3:
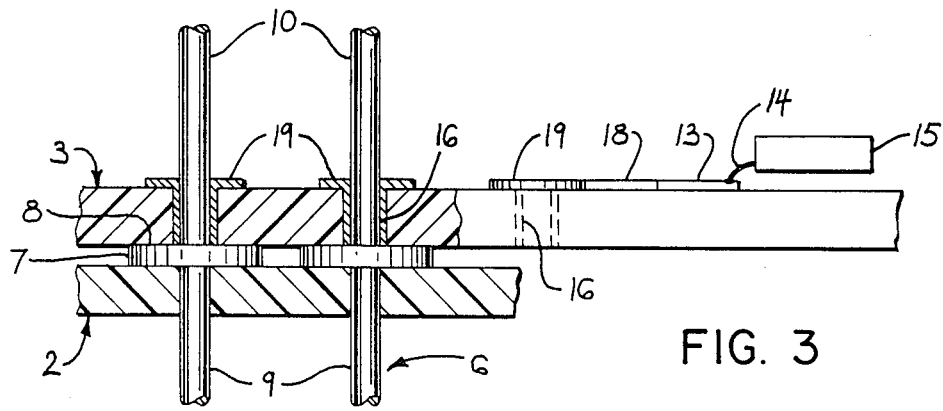
FIG. 3 is a fragmentary sectional view of the unit shown in FIGS. 1 and 2 with parts broken away and sectioned to show details of construction and taken generally on line 3—3 of FIG. 1.

The holes 16 are spaced in accordance with the spacing of the pins 7 in each row of a printed circuit board module. Similarly, the two rows 17 and 17a of holes 16 are laterally spaced in accordance with the lateral spacing of the two rows of through-pins in the vector board adaptor element 2. In use, the surface mount adaptor element 3 is thus placed over the headed pins 7 with the conductive contact 19 around the holes 16 abutting the annular head 8 of the pin 5. The assembly has the pins and apertures connected through any conventional or desired process, such as appropriate conventional surface mount soldering. In assembly, the adaptor element 3 is assembled with element 2, the surface mounted component 15 is secured to the contact pads 13 in accordance with conventional surface mount soldering process, to form a unit such as shown in FIG. 3. Generally, the surface mounted component 15 is aligned with two pads in the rows, with the terminals pads of the surface mounted components engaging the pads. A suitable reflow process converts the pads in a molten state for soldering of the pads to the corresponding aligned leads.

Each row of pads includes a similar plurality of individual pads. Generally, the number of pads provided will be directly related to the number of pins 6 provided in each row 5 of element 2 and in accordance with the required number of contact leads for accomodating particular surface mounted components 15 design.

The final assembly therefore, provides a through-hole or leaded component type mounting of the surface mount component and permits incorporation of the unit into a conventional vector board for appropriate prototyping of a given circuit.

Forming of he adaptor units 2 and 3, of course, can readily be in accordance with the known constructions and may in fact use readily commercially available leaded component adapters. The surface mount adaptor element, in particular, is readily fabricated with known technology including preprinted or etched circuit boards with the solder pads, the connecting holes and leads readily formed in accordance with well known and available technologies.

The illustrated assembly permits the simple necessity of stocking the conventional lead component adapter element 2 as well as the surfaced mounted adaptor element. The surface mounted components can be attached to the adaptor, and the system is directly compatible in use with existing prototype hardware and technologies. The prototype time and cost will be significantly reduced.

In practice, the SMC adaptor units 3 are inventoried for on-demand use with conventional through-hole technology. In addition, the individual surface mount component elements are formed in inventory and connected to the necessary adaptor unit as necessary. If a redesign is made, the adaptor element 2 is removed and replaced and may be retained for subsequent use.

Figure 4:
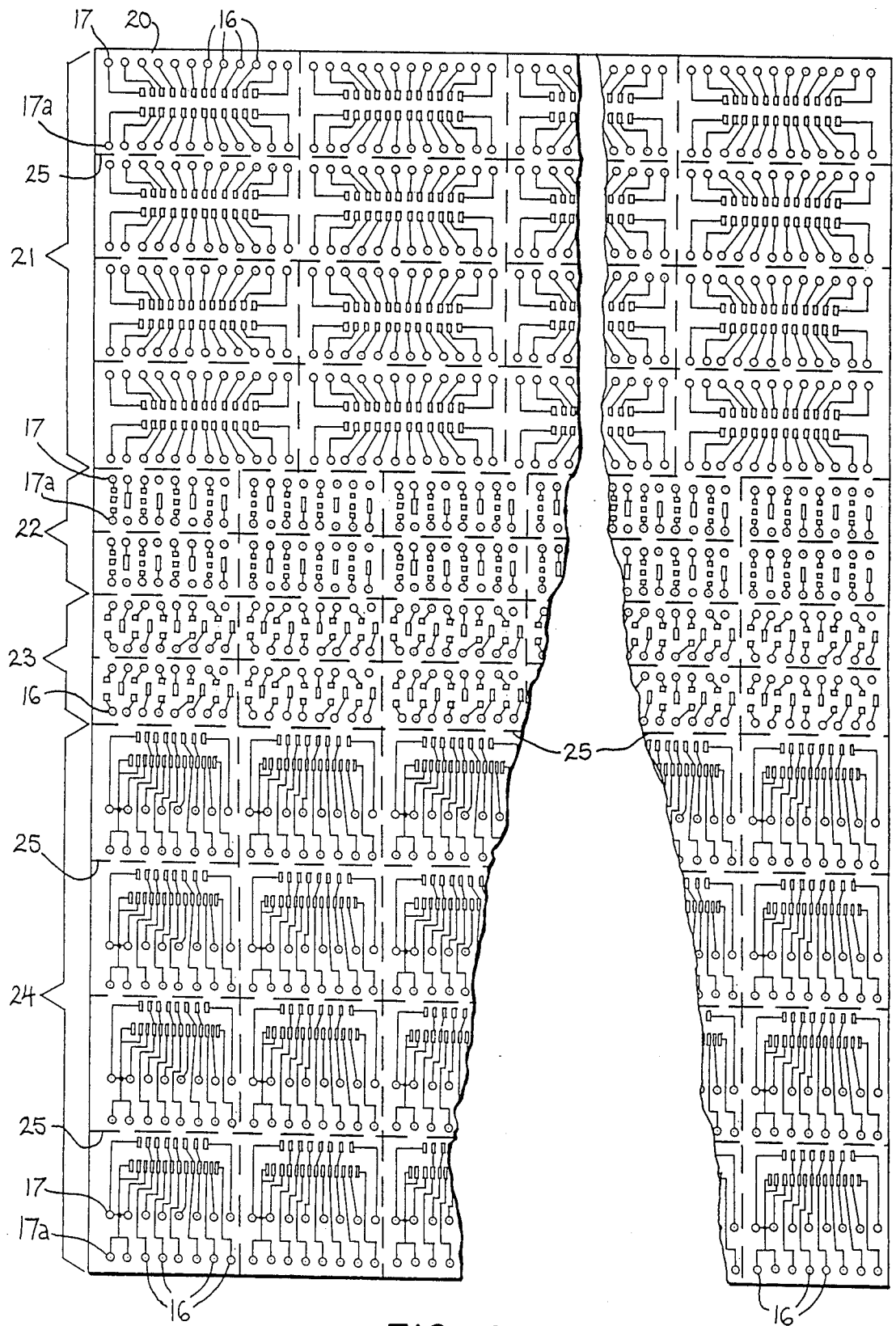
FIG. 4 is a plan view of a sheet including a plurality of different basic formats of the adaptor element for accomodating various basic different surface mounted component chips.

In accordance with another aspect of the present invention, the surface mounted component adaptor element is formed as one of a plurality of different basic elements, and preferably formed in sheet form with a plurality of the elements formed in a production process. For example, an 8½ × 11 sheet 20 of the component adaptor units may be formed such as shown in FIG. 4. The sheet is formed of a flexible printed circuit board material for forming the base 11, and has a plurality of the adaptor elements or units printed thereon. In the illustrated embodiment of the invention, four basically different surface mounted lead arrangements 21, 22, 23 and 24, are illustrated, each of which is adapted to accept a basic surface mounted component widely available in industry.

Each adaptor element 3 is formed with a base pad 13 precisely corresponding to the shape and location of the shape and location of leads of conventional SMC components. The surface mounted component element has the through-hole 16 in rows 17 and 17a spaced to match the pin orientation section of the element 2, as shown in FIGS. 1 and 2. Alternately, the element base 11 may be enlarged with the spaced pin-hole rows 17 and 17a located on one-half of the element and the surface mount component pad assembly on an adjacent opposite half of the element, as shown.

Typical modules are shown for purposes of illustration

The sheet 20 with the imprinted adaptor elements are formed in adjacent rows and columns with each particular adaptor element preferably outlined as by a dotted cut lines 25 for convenience of separation of the elements. More particularly, typical practical sheet 20 is a composite plastic having a thickness of 0.015 inches, which can be readily severed with a knife, scissor or the like. The composite plastic is typically a combination of polyester fibers and glass fibers with an epoxy resin. The sheet 20 is formed with the solder mask and tinned copper connection to the embedded connecting leads. The sheet 20 may of course be of any other desired construction which permits the convenient separation of individual adaptor elements. The lines 25 may of course be scored or otherwise formed to permit more ready separation. Separation may even be made by bending and working of the sheet along scored or weakened separation lines. The number of each particular adaptor element preprinted on a sheet will be generally directly related to the known demand and usage of each particular format of the surface mounted components in the design and prototyping of circuits.

In all instances, the adaptor elements are similarly formed with connecting rows of pins corresponding to that of a conventional leaded element. The surface mounted connecting pads are formed between rows where sufficient space permits and to one side if the through pin module does not provide sufficient space therebetween for acceptance of the surface mounted connecting pad assembly.

The sheets of adaptor elements are readily formed and constructed with known technology and at low cost.

Figure 5:
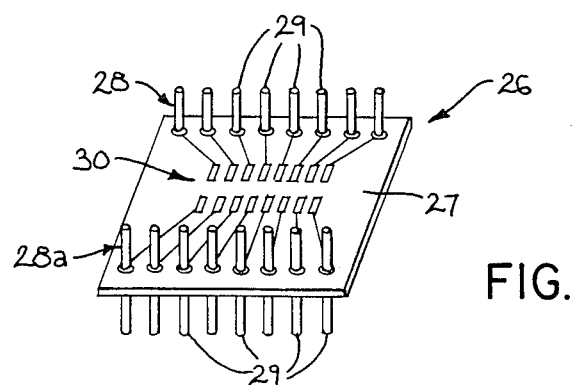
FIG. 5 is a view similar to FIG. 2 illustrating single integral universal component adaptor elements for use with both surface mounted components and conventional leaded components adapters.

Although the illustrated embodiment of the invention will permit the provision of a surface mounted adaptor element for use with conventional present day leaded technology and its elements, a single integrated dual functioning element may also be provided for servicing of both through-hole technology systems and surface mounted systems and combinations thereof, for example, as shown in FIG. 5.

Thus in the embodiment of the FIG. 5, a single integrated element 26 is provided including a base plate 27 having two rows 28 and 28a of throughpins 29 correspondingly spaced in accordance with known through-pin technology. The surface mounted pad assembly 30 is preprinted onto the base plate 27 between the spaced pin rows as in the first embodiment.

The unit of FIG. 5 provides a universal component adaptor for both through-hole technology and the surface mount technology. If conventional through-hole components are incorporated into the prototype, the components are simply soldered from pin to pin on the universal adaptor in accordance with known technology. The surface mounted art work will not make any connection between the pins in the absence of surface mounted components mounted on the pad assembly and providing the desired connection.

If the adaptor is to be used with the surface mounted components, the surface mounted components is simply soldered to the adaptor element using standard surface mounted technology and thereby providing for automatic interconnection to the appropriate through-hole pins. The adaptor element with the surface mounted components is then plugged into the prototype vector board in accordance with known and conventional practice.

In forming of the universal adaptor, component or element, the base may be formed of an appropriate base or sheet material with the appropriate interconnection of the pins directly into the unit. In general practice, they would be formed in accordance with present through-hole constructions as separate distinct modules with the surface mounted component pad assembly on one side or the other of a module.

The present invention thus provides very simple, reliable and effective means of prototyping surface mounted components during new product development or the like.

Various modes of carrying out the invention are contemplated as being within the scope of the following claims particularly pointing out and distinctly claiming the subject matter which is regarded as the invention.

I claim:

1. A surface component adaptor assembly for use with a through-hole prototyping hardware vector boards, comprising a plurality of similar base means formed of an insulating material, each of said base means including through-holes secured to said base means in first and second spaced parallel rows, each row including a plurality of pins connected to said holes and projecting from said base means a first series of said base means including a predetermined array of surface mounted solder pads located in first and second parallel rows of spaced solder pads in alignment with said parallel rows of holes and secured to said base means in accordance with the contact array of a first series of surface mounted components and providing a plurality of said arrays with a pad for each hole in said base means, a second series of said base means including a predetermined array of surface mounted solder pads secured to said base means in first and second parallel rows of spaced solder pads in alignment with said parallel rows of holes and in accordance with the contact array of a second series of surface mounted components different than said first series and providing a plurality of said second arrays with a pad for each hole in said second series of base means, said second series of surface mounted components having a contact array different than said first series of surface mounted components, said first and second series of base means being located in parallel spaced relation to said parallel rows of holes, and printed circuit means secured to said base means in both said series and including a plurality of separate leads connecting each of said holes to selected solder pads to establish a direct and separate connection for each of said pads to said pins, said pins projecting from one side of said base means in both said series and providing for connecting of hard-wired components to the circuit of said surface mounted components and projecting from the opposite side providing for plug-in connection of the base means.

2. The assembly of claim 1 wherein said printed circuit means includes a reflow solder forming said solder pads.

3. The adaptor assembly of claim 1 wherein each of said base means is a sheet of electrical insulating material, said pins are secured within said sheet and projecting to the opposite sides thereof, the pins to one side of the base element providing plug-in connection to a prototype vector board and the pins to the opposite side thereof providing for interconnection of circuit components, said printed circuit means imprinted on said sheet.

4. The adaptor assembly of claim 1 wherein each of said base means includes a first insulating plate, said pins being secured within said plate, and a second adaptor plate abutting said first insulating plate and having two rows of openings spaced in accordance with the pins in said plate and telescoped over said pins, each of said openings having a conductor secured to said opening and said printed circuit means being on said second adaptor plate.

5. The assembly of claim 1 wherein at least one of said first and second series of said base means include said array of said pads arranged and oriented in a row between said two rows of pins.

6. The assembly of claim 1 wherein at least one of said first and second series of said base means include said array of said pads arranged and oriented in a row parallel to said rows of pins and to one side of said rows of pins.

7. A flexible sheet unit for connecting surface mounted components in circuit for comprising a thin flexible sheet formed of a printed circuit board substrate, said sheet having lines outlining the edges of each of said adaptor elements for separation of each adaptor element, a first series of surface mounted component adaptor elements formed in said sheet and located in side-by-side alignment, a second series of surface mounted component adaptor elements formed in said sheet and located in side-by-side alignment adjacent said first row, each of said adaptor elements including a pair of parallel rows of through pin openings with said rows spaced in accordance with leaded component circuit board technology, said openings in each row being equally spaced throughout the length of the row in accordance with the pins on a through-hole pin connector component circuit board whereby each said element is assembled with a through-hole pin connector by placement of the pins to the circuit board, a portion of the adaptor element located adjacent said rows of openings including an array of connecting solder pads secured to said element, said pads including parallel rows of pads with said pads located in accordance with the standard connection of a surface mounted components, said adaptor elements in said first series of said adaptor elements having said pads arranged in a plurality of first identical arrays within each adaptor element in accordance with a first surface mounted component and having a separate opening the rows of openings for each of said pads of said identical arrays and separate printed circuit leads connecting said corresponding pads and openings and said second series of said adaptor elements having said pads arranged in a second identical arrays different than said first arrays in said first series and in accordance with a second surface mounted component, said second series of adaptor elements having a separate opening in the rows of openings to each of said pads of said second identical array and separate printed circuit leads connecting said corresponding pads and openings, and said sheet being readily manually separated on said lines for individual removal of the adaptor elements for releasable connection with said through-pin connecting element, said through-pins projecting through said openings and outwardly of said element and said pins projecting from one side of said base means in both said series and providing for connection of hard-wired components to the circuit of said surface mounted components and projecting from the opposite side providing for plug-in connection of the element.

8. The flexible sheet of claim 7 wherein said sheet includes separating lines about said elements forming an area readily manually separated by a sharp instrument for separating of each of said elements for assembly with a through-hole pin connector.

9. The flexible sheet of claim 7 wherein each group is arranged in a plurality of parallel rows and columns separated lines by said separation between each row and column.

* * * * *

UNITED STATES PATENT AND TRADEMARK OFFICE
CERTIFICATE OF CORRECTION

PATENT NO. : 4,871,317
DATED : October 3, 1989
INVENTOR(S) : Robert E. Jones

It is certified that error appears in the above-identified patent and that said Letters Patent is hereby corrected as shown below:

Col.7, line 11, after "means" insert ---,--- (comma);

Col. 8, line 56, delete "element" and substitute therefore ---elements---; Col. 8, line 64, after "separated" delete "lines"; Col. 8, line 64 after "separation" insert ---lines---.

Signed and Sealed this

Fifth Day of March, 1991

Attest:

HARRY F. MANBECK, JR.

*Attesting Officer*  *Commissioner of Patents and Trademarks*